(12) United States Patent
Ma

(10) Patent No.: US 9,019,192 B2
(45) Date of Patent: Apr. 28, 2015

(54) SHIFT REGISTER UNIT, SHIFT REGISTER CIRCUIT, ARRAY SUBSTRATE AND DISPLAY DEVICE

(71) Applicant: BOE Technology Group Co., Ltd., Beijing (CN)

(72) Inventor: Zhanjie Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/127,121

(22) PCT Filed: Dec. 6, 2012

(86) PCT No.: PCT/CN2012/086039
§ 371 (c)(1),
(2) Date: Dec. 17, 2013

(87) PCT Pub. No.: WO2013/143316
PCT Pub. Date: Oct. 3, 2013

(65) Prior Publication Data
US 2014/0104153 A1    Apr. 17, 2014

(30) Foreign Application Priority Data
Mar. 29, 2012 (CN) .......................... 2012 1 0088683

(51) Int. Cl.
G09G 3/36 (2006.01)
G11C 19/28 (2006.01)
G02F 1/1345 (2006.01)

(52) U.S. Cl.
CPC .............. *G11C 19/28* (2013.01); *G09G 3/3611* (2013.01); *G11C 19/287* (2013.01); *G02F 1/13454* (2013.01); *G09G 2300/0408* (2013.01); *G09G 2310/0286* (2013.01)

(58) Field of Classification Search
USPC ................................ 345/100; 377/64, 67, 79
See application file for complete search history.

(56) References Cited

U.S. PATENT DOCUMENTS 6,345,085 B1 * 2/2002 Yeo et al. .......................... 377/54
2014/0104153 A1 4/2014 Ma

FOREIGN PATENT DOCUMENTS

| CN | 101241765 A | 8/2008 |
|---|---|---|
| CN | 101661798 A | 3/2010 |
| CN | 101677021 A | 3/2010 |
| CN | 102629463 A | 8/2012 |
| KR | 20080014414 A | 2/2008 |
| TW | 200834505 A | 8/2008 |

OTHER PUBLICATIONS

International Search Report; mailed Mar. 14, 2013; PCT/CN2012/086039.
Patentable Claims in CN201210088683.1.

(Continued)

*Primary Examiner* — Yong H Sim
(74) *Attorney, Agent, or Firm* — Ladas & Parry LLP

(57) ABSTRACT

A shift register unit comprises: a first transistor, a pulling-up close unit, a pulling-up start unit, a first pulling-up unit, a second pulling-up unit, a trigger unit, and an output unit. A shift register circuit, an array substrate and a display device are also provided. The shift register unit, the shift register circuit, the array substrate and the display device can reduce drift of a gate threshold voltage of a gate line driving transistor and improve operation stability of devices.

9 Claims, 7 Drawing Sheets

(56) References Cited

OTHER PUBLICATIONS

First Chinese Office Action issued Mar. 20, 2013; Appln. 201210088683.1.
Chinese Notice of Patent Grant issued Aug. 27, 2013; Appln. 201210088683.1.
International Search Report dated May 3, 2013; PCT/CN2012/086039.
International Preliminary Report on Patentability dated Oct. 1, 2014; PCT/CN2012/086039.

* cited by examiner

SHIFT REGISTER UNIT, SHIFT REGISTER CIRCUIT, ARRAY SUBSTRATE AND DISPLAY DEVICE

TECHNICAL FIELD OF THE DISCLOSURE

The present disclosure relates to a field of liquid crystal display manufacture, and particularly, relates to a shift register unit, a shift register circuit, an array substrate and a display device.

BACKGROUND

In recent years, developments in displays present a development trend of high integrity and low cost. A very important technique among the developments is an implementation for mass production of GOA (Gate Driver on Array) technique. A TFT (Thin Film Transistor) gate switching circuit is integrated on an array substrate of a display panel by using the GOA technique to form a scan driving of the display panel, so that a gate driving integrate circuit part may be omitted. Thus, product cost may be reduced in terms of both material cost and manufacture process cost, and the display panel may be designed aesthetically with symmetrical sides and thin frame. Also, it benefits productivity and yield enhancement since a process for bonding in a gate direction may be omitted. The gate switching circuit integrated on the array substrate by using the GOA technique is also referred to as a GOA circuit or a shift register circuit. In a shift register circuit provided in prior art, each of shift register units includes 6 TFTs and 2 capacitors, as shown in FIG. 1, signal terminals include 3 clock signal terminals, a signal input terminal, 2 DC signal terminals (VDD (high level) terminal and VSS (low level) terminal), and an output terminal (OUTPUT). When the signal input terminal inputs a frame start signal STV and a first clock signal terminal CLK1 inputs a low level signal, a capacitor C1 holds the input frame start signal STV (low level signal), which keeps a driving transistor T8 in a turn-on state; when a second clock signal terminal CLK2 inputs the low level signal, the driving transistor T8 outputs the low level signal at the second clock signal terminal; when a third clock signal terminal CLK3 inputs the low level signal, a high voltage VDD pulls the level of the output terminal OUTPUT up and pulls the level of a node A up, such that the transistor T8 recovers to a turn-off state. The output terminal of each of shift register unit is connected to the signal input of the next shift register unit.

Since the shift register circuit is produced directly on the array substrate through a backplane process, instability in the backplane process, especially in LIPS (Low Temperature Poly-silicon) process, may result in characteristic differences among TFTs on the backplane, especially the drift of a gate threshold voltage Vth of the TFTs, which in turn causes a mal-operation of the shift register circuit. In addition, during a test for display reliability of the display product, characteristics of TFTs may change when TFTs are placed in a high-temperature high-humidity environment, which results in a Vth drift phenomena of TFTs during the operation of the shift register circuit. Therefore, the shift register circuit provided in the prior art may have a drift phenomenon in the outputted TFT gate threshold voltage Vth, which further affects the stability of output characteristics of the output terminal of the shift register circuit.

SUMMARY

Embodiments of the present disclosure provide a shift register unit, a shift register circuit, an array substrate and a display device, which can improve the drift of TFT gate threshold voltage Vth effectively, and ensure the stability of the output characteristics of the output terminal.

The embodiments of the present disclosure adopt the following technical solutions.

According to one aspect of the present disclosure, there is provided a shift register unit comprising: a first transistor, a gate thereof being connected with an input signal terminal; a pulling-up close unit connected with a second level terminal, the input signal terminal and a control node B; a pulling-up start unit connected with a first level terminal, a third clock signal terminal and the control node B; a first pulling-up unit connected with the second level terminal, the control node B and a source of the first transistor; a second pulling-up unit connected with the second level terminal, the control node B and an output terminal; a trigger unit connected with a first clock signal terminal, the input signal terminal and the source of the first transistor; an output unit connected with a second clock signal terminal, the output terminal and a drain of the first transistor.

The pulling-up close unit closes the first pulling-up unit and the second pulling-up unit when the input signal terminal inputs a first level, the pulling-up start unit starts the first pulling-up unit and the second pulling-up unit when the third clock signal terminal inputs the first level; the first pulling-up unit, when it is started, pulls up a source level of the first transistor, and the second pulling-up unit, when it is started, pulls up a level at the output terminal; the trigger unit outputs an input signal to the source of the first transistor when the first clock signal terminal inputs the first level, the first transistor outputs the input signal to the output unit when the input signal terminal inputs the first level, the output unit holds the input signal and outputs the input signal when the second clock signal terminal inputs the first level; meanwhile the first transistor keeps in a turn-off state when the input signal terminal inputs a second level.

The shift register unit further comprises a second transistor, a gate thereof being connected with the control node B, a source thereof being connected with the source of the first transistor, a drain thereof being connected with the drain of the first transistor. The second transistor keeps being turned on to pull up a drain level of the first transistor and stop the output unit from outputting a signal when the control node B is at the first level; and the second transistor keeps being turned off when the control node B is at the second level.

The pulling-up close unit comprises a fifth transistor, a gate of the fifth transistor being connected with the input signal terminal, a source of the fifth transistor being connected with the second level terminal, and a drain of the fifth transistor being connected with the control node B.

The pulling-up start unit comprises a sixth transistor, a gate of the sixth transistor being connected with the third clock signal terminal, a source of the sixth transistor being connected with the first level terminal, and a drain of the sixth transistor being connected with the control node B.

The first pulling-up unit comprises a fourth transistor, a gate of the fourth transistor being connected with the control node B, a source of the fourth transistor being connected with the second level terminal, and a drain of the fourth transistor being connected with the source of the first transistor.

The second pulling-up unit comprises a seventh transistor and a second capacitor, a gate of the seventh transistor being connected with the control node B, a source of the seventh transistor being connected with the second level terminal, and a drain of the seventh transistor being connected with the output terminal; and two electrodes of the second capacitor being connected to the gate and the source of the seventh transistor, respectively.

The trigger unit comprises a third transistor, a gate of the third transistor being connected with the first clock signal terminal, a source of the third transistor being connected with the input signal terminal, and a drain of the third transistor being connected with the source of the first transistor.

The output unit comprises an eighth transistor and a first capacitor, a gate of the eighth transistor being connected to the drain of the first transistor, a source of the eighth transistor being connected to the second clock signal terminal, and a drain of the eighth transistor being connected to the output terminal; and two electrodes of the first capacitor being connected with the gate and the drain of the eighth transistor, respectively.

Duty ratios of the first level of the clock signals at the first clock signal terminal, the second clock signal terminal and the third clock signal terminal are all 1:3.

A first level signal at the second clock signal terminal begins after the first level signal at the first clock signal terminal ends, the first level signal at the third clock signal terminal begins after the first level signal at the second clock signal terminal ends, and a next first level signal at the first clock signal terminal begins after the first level at the third clock signal terminal ends.

The respective transistors are P-type transistors, the first level is a low level, the second level is a high level, the first level terminal is a low level terminal, and the second level terminal is a high level terminal. Or, the respective transistors are N-type transistors, the first level is a high level, the second level is a low level, the first level terminal is a high level terminal, and the second level terminal is a low level terminal.

According to another aspect of the present disclosure, there is provided a shift register circuit comprising a plurality of shift register units described above connected in series, and except for a first shift register unit and a last shift register unit, the output terminal of each of remaining shift register units is connected to the input signal terminal of a next shift register unit adjacent thereto.

According to still another aspect of the present disclosure, there is provided an array substrate on which a shift register circuit is formed, the shift register circuit is the above described shift register circuit.

According to still another aspect of the present disclosure, there is provided a display device comprising a display area having a plurality of pixels for displaying an image; a shift register circuit for transferring a scanning signal to the display area; and a data driving circuit for transferring a data signal to the display area, wherein the shift register circuit is the above described shift resister circuit.

The shift register unit, the shift register circuit, the array substrate and the display device provided in the embodiments of the present disclosure can improve the drift of TFT gate threshold voltage Vth effectively, and ensure the stability of the output characteristics of the output terminal.

BRIEF DESCRIPTION OF THE DRAWINGS

In order to illustrate embodiments of the disclosure or technical solutions in the prior art clearly, drawings required for a description of the embodiments or the prior art will be described briefly. Apparently, the drawings in the following description are only some embodiments of the present disclosure, and those of ordinary skill in the art may obtain other drawings based on these drawings without creative labors.

DETAILED DESCRIPTION

Figure 1:
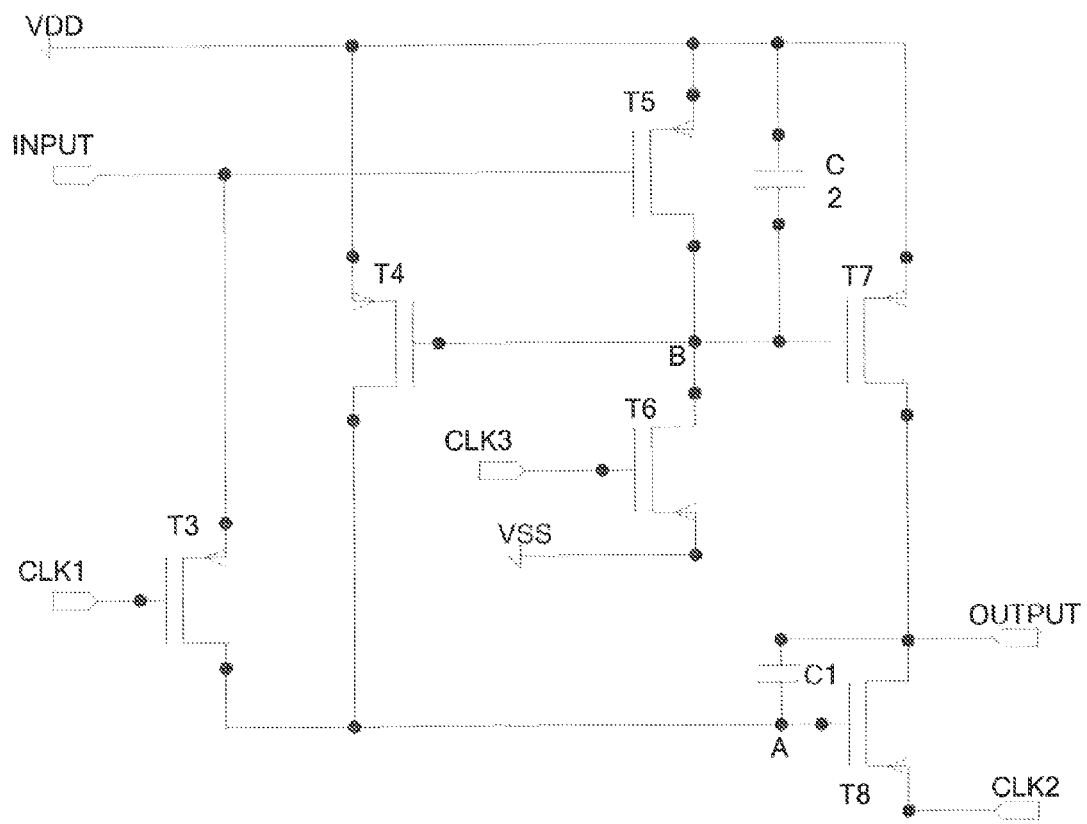
FIG. 1 is a schematic diagram illustrating a structure of a shift register unit provided in prior art.

Solutions in the embodiments of the present disclosure will be described clearly and completely below in conjunction with the accompanying drawings of the embodiments of the present disclosure. It is obvious that the described embodiments are only part of the embodiments of the present disclosure, but not all the embodiments. Based on the embodiments of the present disclosure, other embodiments obtained by those ordinary skilled in the art without creative labors would belong to the protection scope of the present disclosure.

Transistors utilized in all embodiments of the present disclosure may be thin film transistors or FET transistors, or other devices having same features. A drain and a source of the transistor used here are symmetrical, so the drain and the source have no difference. In the embodiments of the present disclosure, to distinguish between the two electrodes other than a gate of the transistor, one is referred to as a drain, and the other is referred as a source. It is prescribed that according to the pattern of the transistor in the drawings, a middle terminal of the transistor is a gate, a signal input terminal is a source and a signal output terminal is a drain. In addition, all of the transistors adopted in the embodiments of the present disclosure are P-type transistors, which are turned on when the gates are at a low level.

A shift register circuit provided in an embodiment of the present disclosure comprises a plurality of shift register units described above connected in series, and except for a first shift register unit and a last shift register unit, the output terminal of each of remaining shift register units is connected to the input signal terminal of a next shift register unit adjacent thereto.

Figure 2:
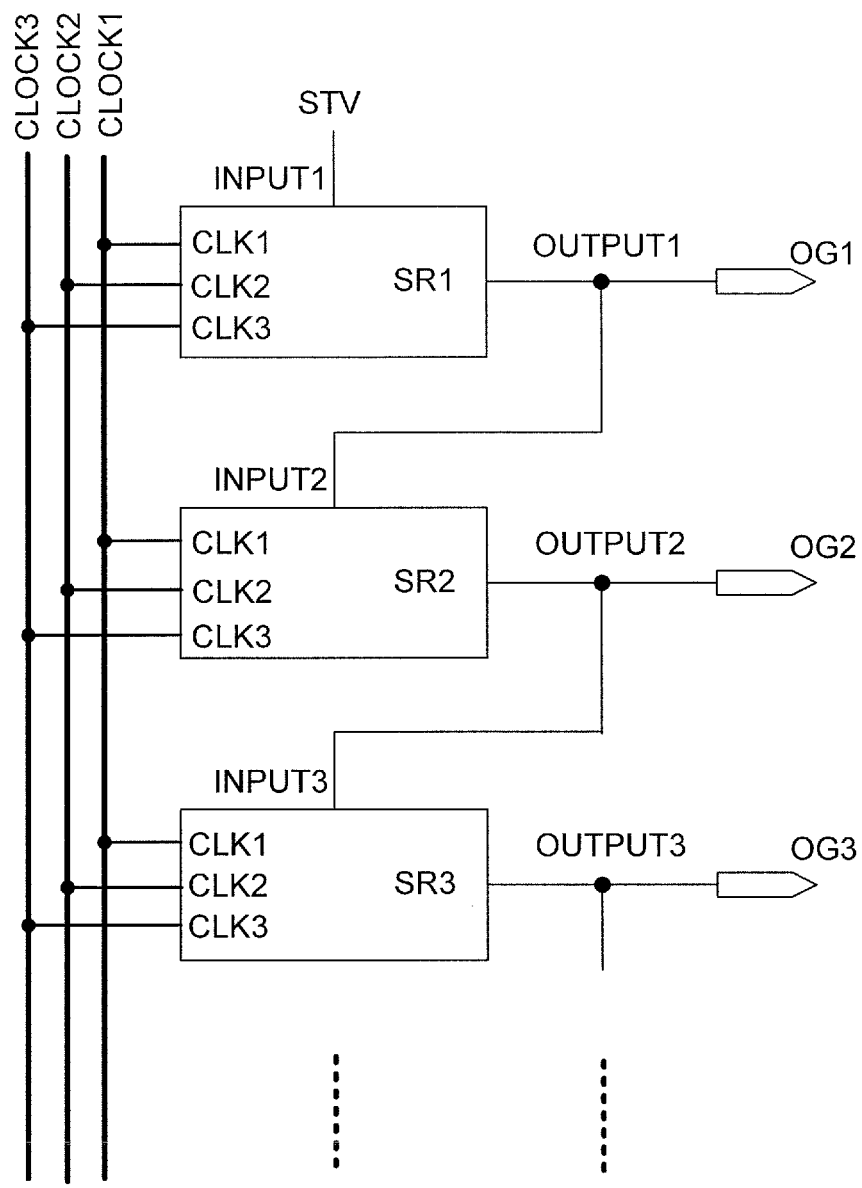
FIG. 2 is a schematic diagram illustrating a circuit structure of a shift register circuit provided in an embodiment of the present disclosure.

Particularly, as shown in FIG. 2, the shift register circuit comprises several shift register units connected in series, wherein an output terminal OUTPUT1 of a shift register unit SR1 is connected to an input terminal INPUT2 of a shift register unit SR2 and connected to a gate line OG1; an output terminal OUTPUT2 of the shift register unit SR2 is connected to an input terminal INPUT3 of a shift register unit SR3 and connected to a gate line OG2; and other shift register units are connected similarly. Each of the shift register units has a first clock signal terminal CLK1, a second clock signal terminal CLK2 and a third clock signal terminal CLK3, wherein the first clock signal terminal CLK1 receives a system clock signal CLOCK1, the second clock signal terminal CLK2 receives a system clock signal CLOCK2 and the third clock signal terminal CLK3 receives a system clock signal CLOCK3. Low level duty ratios of the system clock signal CLOCK1, CLOCK2 and CLOCK 3 are all 1:3, the low level of CLOCK2 begins after the low level of CLOCK1 ends, the low level of CLOCK3 begins after the low level of CLOCK2 ends, and a next low level of CLOCK1 begins after the low level of CLOCK3 ends, such a loop is repeated thereafter. In the present embodiment, the first shift register unit is the shift register unit SR1, the input signal INPUT1 of the shift register unit SR1 is an activation pulse signal, such as a frame start signal STV, and the low level of STV begins and ends simultaneously with the system clock signal CLOCK1.

Figure 3:
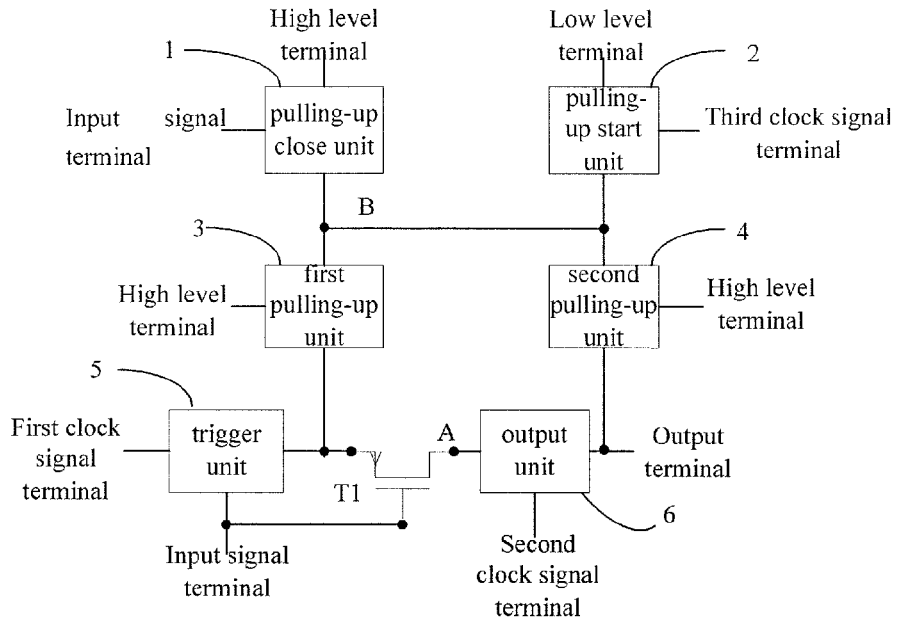
FIG. 3 is a schematic diagram illustrating a structure of a shift register unit provided in the embodiment of the present disclosure.

FIG. 3 is a schematic diagram illustrating a structure of any shift register unit in the above described shift register circuit provided in the embodiment of the present disclosure. The shift register unit comprises: a first transistor T1, a gate thereof being connected with an input signal terminal INPUT; a pulling-up close unit 1 connected with a high level terminal VDD, the input signal terminal INPUT and a control node B; a pulling-up start unit 2 connected with a level terminal VSS, a third clock signal terminal CLK3 and the control node B; a first pulling-up unit 3 connected with the high level terminal VDD, the control node B and a source of the first transistor T1; a second pulling-up unit 4 connected with the high level terminal VDD, the control node B and an output terminal OUTPUT; a trigger unit 5 connected with a first clock signal terminal CLK1, the input signal terminal INPUT and the source of the first transistor T1; an output unit 6 connected with a second clock signal terminal CLK2, the output terminal OUTPUT and a drain of the first transistor T1.

The pulling-up close unit 1 closes the first pulling-up unit 3 and the second pulling-up unit 4 when the input signal terminal INPUT inputs a low level, the pulling-up start unit 2 starts the first pulling-up unit 3 and the second pulling-up unit 4 when the third clock signal terminal CLK3 inputs the low level; the first pulling-up unit 3 pulls up a source level of the first transistor T1 when it is started, and the second pulling-up unit 4 pulls up a level at the output terminal OUTPUT when it is started; the trigger unit 5 outputs an input signal to the source of the first transistor T1 when the first clock signal terminal CLK1 inputs the low level, the first transistor T1 outputs the input signal to the output unit 6 when the input signal terminal INPUT inputs the low level, and the output unit 6 holds the input signal, and outputs the input signal when the second clock signal terminal CLK2 inputs the low level; meanwhile the first transistor T1 keeps in a turn-off state when the input signal terminal INPUT inputs the high level, so as to avoid its drain from voltage drifting.

Figure 4:
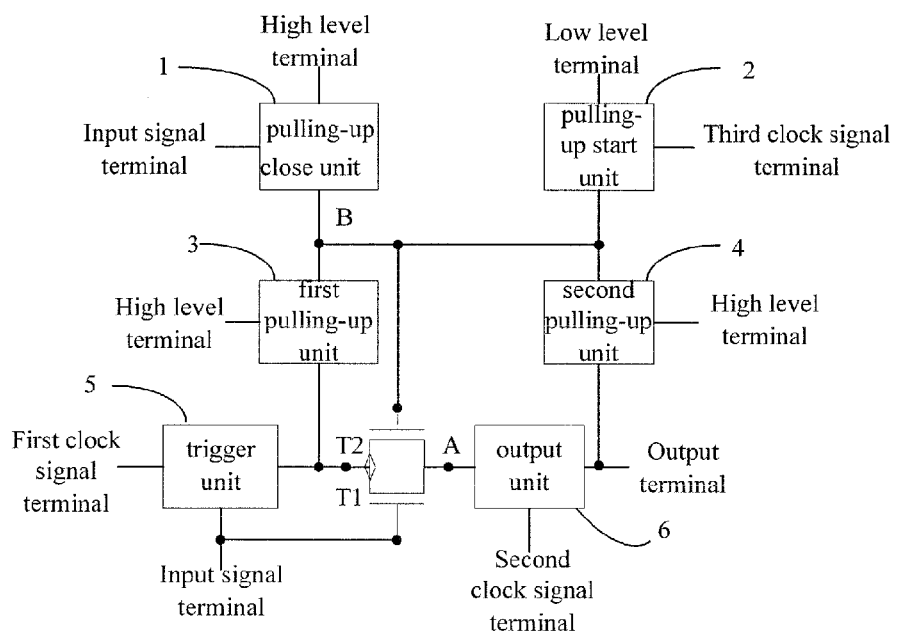
FIG. 4 is a schematic diagram illustrating a structure of a shift register unit provided in another embodiment of the present disclosure.

Optionally, as shown in FIG. 4, the shift register unit provided in the embodiment of the present disclosure further comprises a second transistor T2, a gate of the second transistor T2 being connected to the control node B, a source being connected to the source of the first transistor T1, a drain being connected to the drain of the first transistor T1. The second transistor T2 keeps being turned on to pull up a drain level of the first transistor T1 stop the output unit from outputting a signal when the control node B is at the low level; and the second transistor keeps being turned off when the control node B is at the high level, so as to avoid the voltage drift on the drain of the first transistor.

Figure 5:
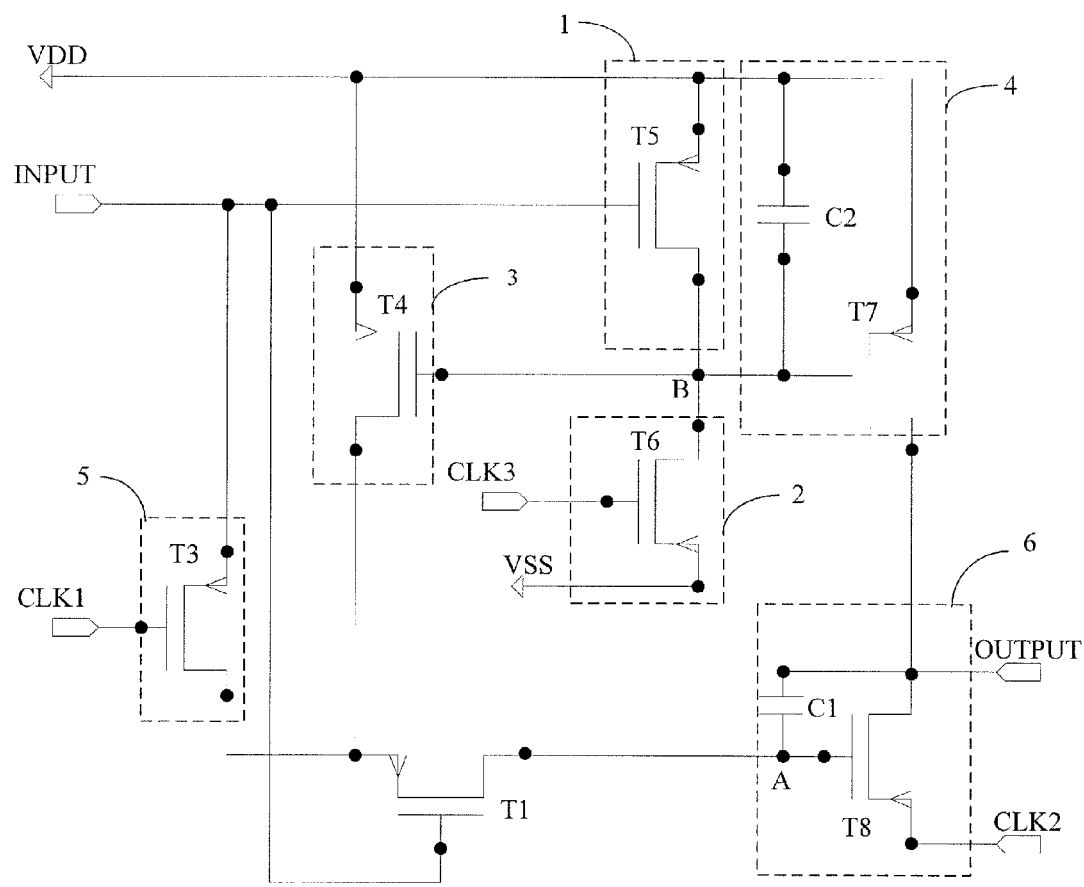
FIG. 5 is a schematic diagram illustrating a structure of a shift register unit provided in still another embodiment of the present disclosure.

Optionally, FIG. 5 shows a shift register circuit provided in the embodiment of the present disclosure, wherein, the pulling-up close unit 1 comprises a fifth transistor T5, a gate of the fifth transistor T5 is connected to the input signal terminal INPUT, a source of the fifth transistor is connected to the high level terminal VDD and a drain of the fifth transistor is connected to the control node B;

the pulling-up start unit 2 comprises a sixth transistor T6, a gate of the sixth transistor T6 is connected to the third clock signal terminal CLK3, a source of the sixth transistor T6 is connected to the low level terminal VSS and a drain of the sixth transistor T6 is connected to the control node B;

the first pulling-up unit 3 comprises a fourth transistor T4, a gate of the fourth transistor T4 is connected to the control node B, a source of the fourth transistor T4 is connected to the high level terminal VDD and a drain of the fourth transistor T4 is connected to the source of the first transistor T1;

the second pulling-up unit 4 comprises a seventh transistor T7 and a second capacitor C2, a gate of the seventh transistor T7 is connected to the control node B, a source of the seventh transistor T7 is connected to the high level terminal VDD and a drain of the seventh transistor T7 is connected to the output terminal OUTPUT, and the two electrodes of the second capacitor C2 are connected to the gate and the source of the seventh transistor T7, respectively;

the trigger unit 5 comprises a third transistor T3, a gate of the third transistor T3 is connected to the first clock signal terminal CLK1, a source of the third transistor T3 is connected to the input signal terminal INPUT and a drain of the third transistor T3 is connected to the source of the first transistor T1;

the output unit 6 comprises an eighth transistor T8 and a first capacitor C1, a gate of the eighth transistor T8 is connected to the drain of the first transistor T1, a source of the eighth transistor T8 is connected to the second clock signal terminal CLK2 and a drain of the eighth transistor T8 is connected to the output terminal OUTPUT, and the two electrodes of the first capacitor C1 are connected to the gate and the drain of the eighth transistor T8, respectively.

Figure 6:
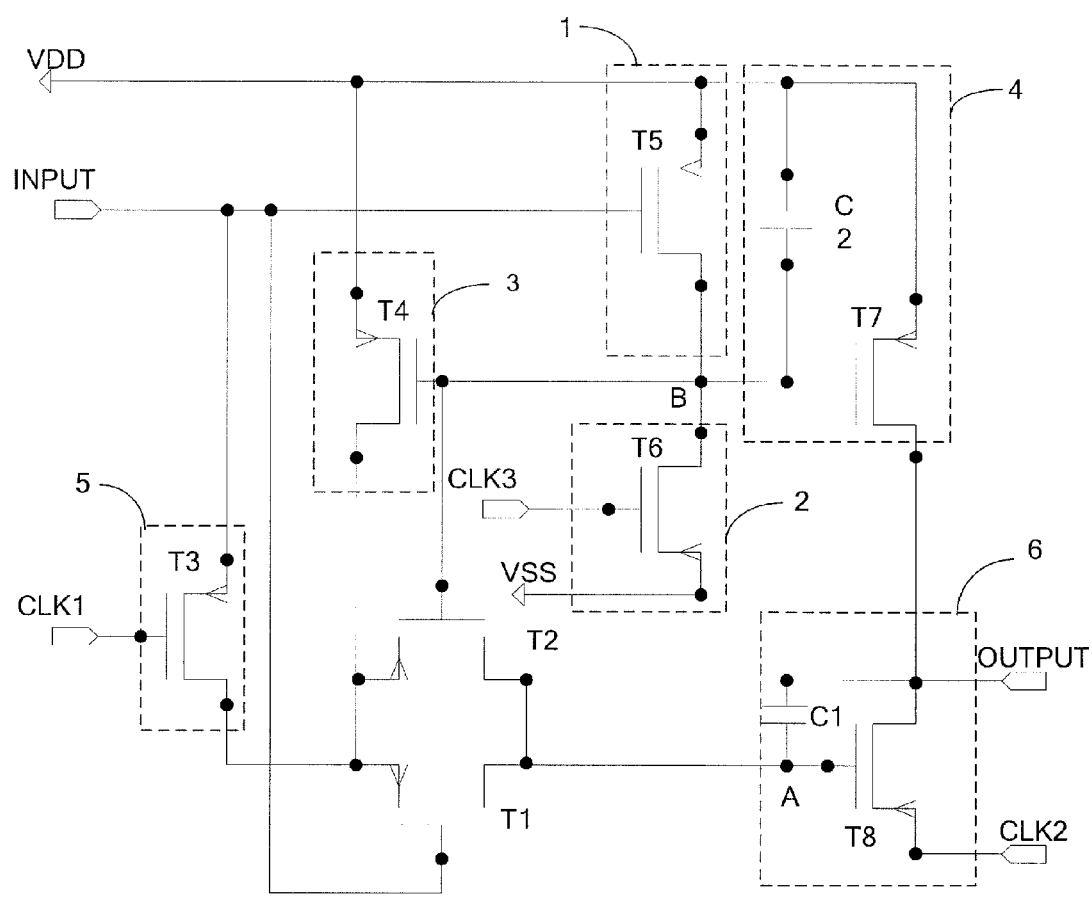
FIG. 6 is a schematic diagram illustrating a structure of a shift register unit provided in yet still another embodiment of the present disclosure.

Optionally, FIG. 6 shows a shift register circuit provided in another embodiment of the present disclosure, wherein a second transistor T2 is added on the basis of the shift register circuit shown in FIG. 3. A gate of the second transistor 12 is connected to the control node B, a source of the second transistor T2 is connected to the source of the first transistor T1 and a drain of the second transistor T2 is connected to the drain of the first transistor T1. Other devices and their connections are same as those in FIG. 3, and thus repeated descriptions are omitted. Since the second transistor T2 is added, the second transistor keeps being turned on to pull up the drain level of the first transistor (i.e. the level at point A in FIG. 6) and stop the output unit from outputting a signal when the control node B is at the low level; the second transistor keeps in a turn-off state when the control node B is at the high level, to avoid the voltage drift on the drain of the first transistor.

Figure 7:
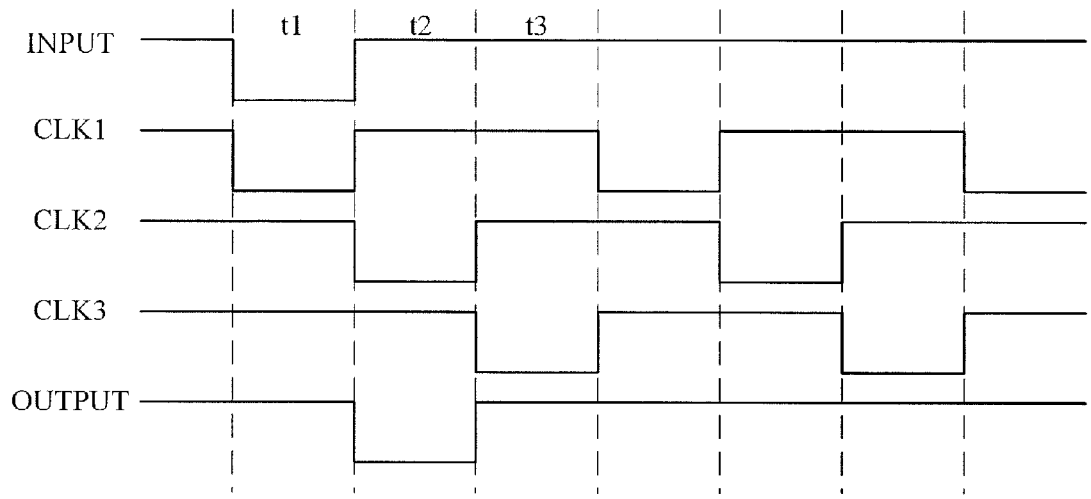
FIG. 7 is a schematic diagram illustrating timing sequence states of clock signals of the shift register unit provided in the embodiments of the present disclosure.

In connection with timing sequence states as shown in FIG. 7, the shift register unit provided in the embodiments of the present disclosure as shown in FIG. 6 operates as follows.

During a period t1, the first clock signal terminal CLK1 and the input signal terminal INPUT (taking that the input signal is the frame start signal STV as an example) input the low level signal simultaneously, T3, T5 and T1 are turned on at this time, the low level signal is transmitted to the node A (i.e., the gate of T8) through T3 and T1 and is saved by the storage capacitor C1. Meanwhile T5 is turned on, and the high level signal at the high level terminal VDD is transmitted to the control node B, which ensures that T7, T4 and T2 are turned off under the control of node B.

During a period t2, the signal at the first clock signal terminal CLK1 becomes the high level signal and the signal at the second clock signal terminal CLK2 becomes the low level signal from the high level signal. T1, T2, T3 and T4 are turned-off at this time, and a mutual embedded structure of T1 and T2 can well reduce a voltage variation at node A, and ensure that the low level signal at the second clock signal terminal CLK2 is transmitted to the output terminal OUTPUT through T8 perfectly.

During a period t3, the second clock signal terminal CLK2 changes to the high level from the low level and the third clock signal terminal CLK3 changes to the low level from the high level. At this time, T6 is turned on, the low level signal at the low level terminal VSS is output to the control node B, and T7, T4 and T2 are turned on by the low level signal at the control node B; and the high level signal at the high level terminal VDD is transmitted to the output terminal OUTPUT through T7, and the high level signal at the high level terminal VDD is transmitted to the node A through T4 and T2 at the same time, such that the node A is pulled up to turn off T8.

Figure 8:
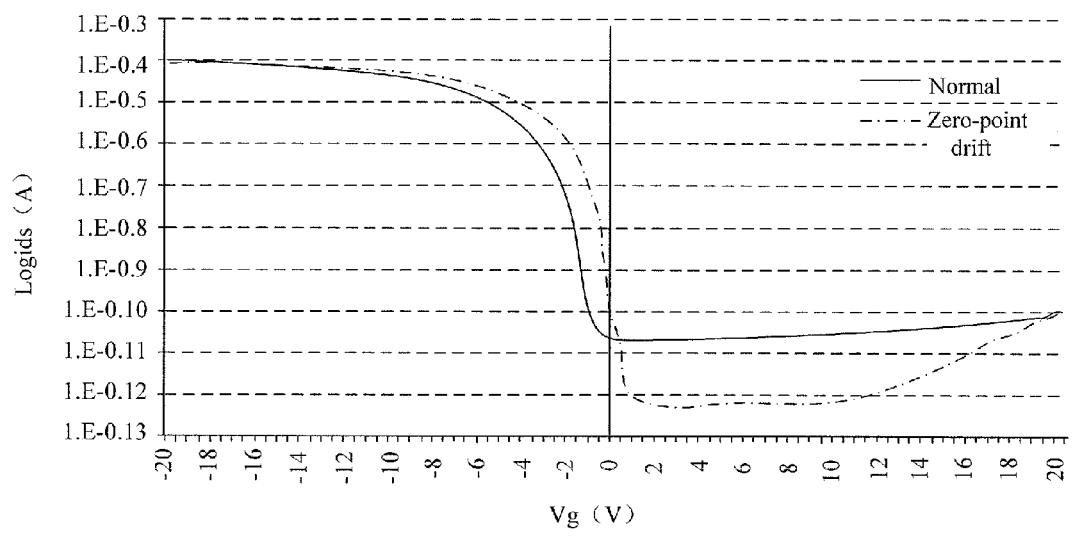
FIG. 8 is a schematic diagram illustrating the relationship between a gate voltage and a source-drain current of a transistor provided in the embodiments of the present disclosure.
Figure 9:
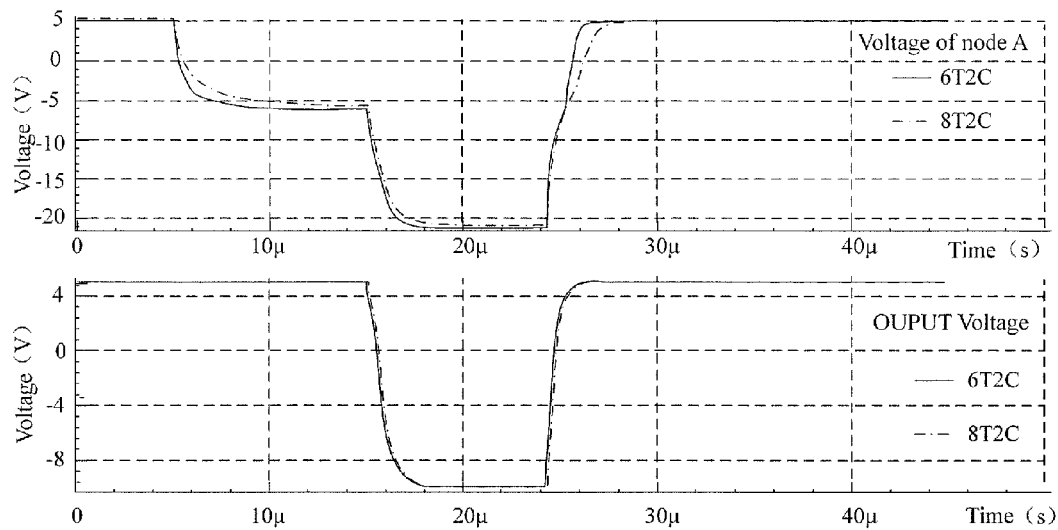
FIG. 9 is a schematic diagram illustrating a simulation result for the shift register unit provided in the embodiments of the present disclosure.
Figure 10:
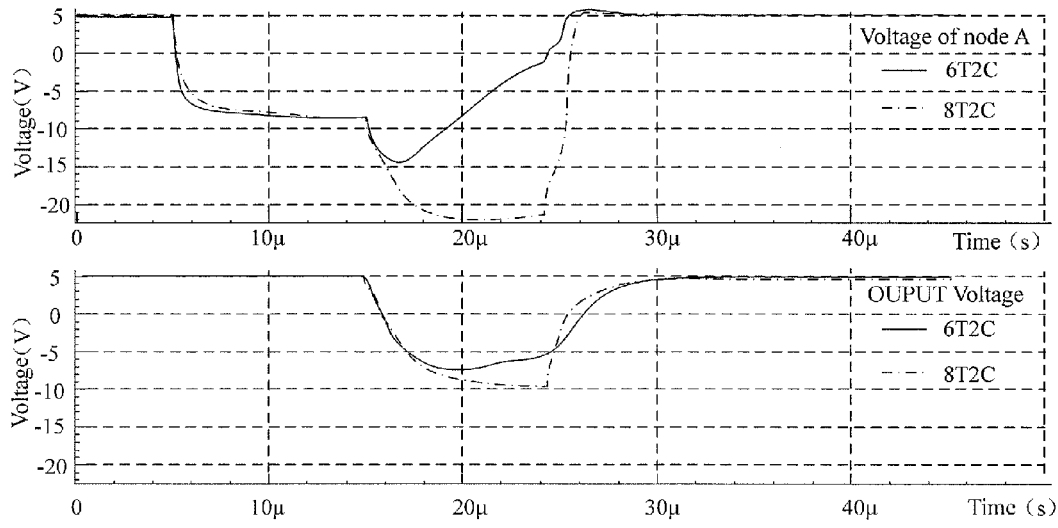
FIG. 10 is a schematic diagram illustrating another simulation result for the shift register unit provided in the embodiments of the present disclosure.

FIG. 8 is a schematic diagram illustrating a relationship between the gate voltage and the source-drain current of the transistor, which illustrates the relationship between a logarithm of the source-drain current of the transistor (Log ids (A)) and a gate voltage Vg(V) under a zero-point drift case and a normal case. Based on such a relationship, schematic diagrams of simulation results of the shift register unit as shown in FIG. 9 and FIG. 10 are further provided in embodiments of the present disclosure. FIG. 9 is a diagram illustrating waveform simulation of voltages at the node A and the output terminal OUTPUT of the shift register unit (8T2C structure, the operation simulation diagram of 7T2C structure is not shown) provided in the embodiments of the present disclosure and of the shift register unit (6T2C structure) in the prior art, when the zero-point drift current is small. FIG. 10 is a diagram illustrating waveform simulation of voltages at the node A and the output terminal OUTPUT of the shift register unit (8T2C structure, the operation simulation diagram of 7T2C structure is not shown) provided in the embodiments of the present disclosure and of the shift register unit (6T2C structure) in the prior art, when the zero-point drift current is large. It can be seen that the characteristic curve of the transistor shifts rightwards when the zero-point drift current is large, the output of the circuit with the 6T2C structure is small, which can not satisfy a normal output requirement, and thus affects stability of the output characteristics. However, the shift register unit provided in the embodiments of the present disclosure can improve the drift of the outputted TFT gate threshold voltage Vth effectively when the zero-point drift current is large, and thus ensures the stability of the output characteristics of the output terminal.

The embodiments of the present disclosure can also be implemented by using N-type transistors which are turned on when the gates are at the high level, and there is no need to change the circuit structure, only the timing sequences of the input signals need to be adjusted appropriately.

The shift register unit and the shift register circuit provided in the embodiments of the present disclosure may improve the drift of the outputted TFT gate threshold voltage Vth effectively and ensure the stability of the output characteristics of the output terminal.

Furthermore, an embodiment of the present disclosure provides an array substrate on which a shift register circuit is formed; and the shift register circuit is the shift register circuit described above.

An embodiment of the present disclosure further provides a display device, such as a display panel, comprising:

a display area having a plurality of pixels for displaying an image; a shift register circuit for transferring a scanning signal to the display area; and a data driving circuit for transferring a data signal to the display area. Wherein the shift register circuit is the shift register circuit described above. Additionally, the display device may be a display apparatus such as an electric paper, a mobile phone, a TV, a digital photo frame, and the like.

Those ordinarily skilled in the art can understand that all or part of the steps implementing the above method embodiments can be accomplished by a hardware relevant to programs and/or instructions, wherein the program may be stored in a computer readable storage medium, and the program, when executed, performs the steps including the above method embodiment; the storage media includes: ROM, RAM, disk or CD-ROM, and other media capable of storing program codes.

Above are only specific embodiments of the present disclosure, but the scope of the present disclosure is not limited thereto, and changes or replacements which can be conceived easily by any persons skilled in the art are covered within the scope sought for protection of the present disclosure. Thus, the scope of the invention should be defined by the claims.

What is claimed is:

1. A shift register unit, comprising:
a first transistor, a gate thereof being connected with an input signal terminal;
a pulling-up close unit connected with a high level terminal, the input signal terminal and a control node B;
a pulling-up start unit connected with a low level terminal, a third clock signal terminal and the control node B;
a first pulling-up unit connected with the high level terminal, the control node B and a source of the first transistor;
a second pulling-up unit connected with the high level terminal, the control node B and an output terminal;
a trigger unit connected with a first clock signal terminal, the input signal terminal and the source of the first transistor;
an output unit connected with a second clock signal terminal, the output terminal and a drain of the first transistor;
a second transistor, a gate thereof being connected with the control node B, a source thereof being connected with the source of the first transistor, a drain thereof being connected with the drain of the first transistor;
wherein the pulling-up close unit closes the first pulling-up unit and the second pulling-up unit when the input signal terminal inputs a low level, the pulling-up start unit starts the first pulling-up unit and the second pulling-up unit when the third clock signal terminal inputs the low level; the first pulling-up unit, when it is started, pulls up a source level of the first transistor, and the second pulling-up unit, when it is started, pulls up a level at the output terminal; the trigger unit outputs an input signal to the source of the first transistor when the first clock signal terminal inputs the low level, the first transistor inputs the input signal to the output unit when the input signal terminal inputs the low level, the output unit holds the input signal, and outputs the input signal when the second clock signal terminal inputs the low level; meanwhile the first transistor keeps in a turn-off state when the input signal terminal inputs a high level; the second transistor keeps being turned on to pull up a drain level of the first transistor and stop the output unit from outputting a signal when the control node B is at the low level; and the second transistor keeps being turned off when the control node B is at the high level.

2. The shift register unit according to claim 1, wherein
the pulling-up close unit comprises a fifth transistor, a gate of the fifth transistor being connected with the input signal terminal, a source of the fifth transistor being connected with the high level terminal, and a drain of the fifth transistor being connected with the control node B;
the pulling-up start unit comprises a sixth transistor, a gate of the sixth transistor being connected with the third clock signal terminal, a source of the sixth transistor being connected with the low level terminal, and a drain of the sixth transistor being connected with the control node B;
the first pulling-up unit comprises a fourth transistor, a gate of the fourth transistor being connected with the control node B, a source of the fourth transistor being connected with the high level terminal, and a drain of the fourth transistor being connected with the source of the first transistor;
the second pulling-up unit comprises a seventh transistor and a second capacitor, a gate of the seventh transistor being connected with the control node B, a source of the seventh transistor being connected with the high level terminal, and a drain of the seventh transistor being connected with the output terminal; and two electrodes of the second capacitor being connected to the gate and the source of the seventh transistor, respectively;
the trigger unit comprises a third transistor, a gate of the third transistor being connected with the first clock signal terminal, a source of the third transistor being connected with the input signal terminal, and a drain of the third transistor being connected with the source of the first transistor;
the output unit comprises an eighth transistor and a first capacitor, a gate of the eighth transistor being connected to the drain of the first transistor, a source of the eighth transistor being connected to the second clock signal terminal, and a drain of the eighth transistor being connected to the output terminal; and two electrodes of the first capacitor being connected with the gate and the drain of the eighth transistor, respectively.

3. The shift register unit according to claim 2, wherein duty ratios of the low level of the clock signals at the first clock signal terminal, the second clock signal terminal and the third clock signal terminal are all 1:3.

4. The shift register unit according to claim 3, wherein a low level signal at the second clock signal terminal begins after the low level signal at the first clock signal terminal ends, the low level signal at the third clock signal terminal begins after the low level signal at the second clock signal terminal ends, and a next low level signal at the first clock signal terminal begins after the low level at the third clock signal terminal ends.

5. A shift register circuit, comprising a plurality of shift register units connected in series,
each of the shift register units comprising:
a first transistor, a gate thereof being connected with an input signal terminal,
a pulling-up close unit connected with a high level terminal, the input signal terminal and a control node B;
a pulling-up start unit connected with a low level terminal, a third clock signal terminal and the control node B;
a first pulling-up unit connected with the high level terminal, the control node B and a source of the first transistor;
a second pulling-up unit connected with the high level terminal, the control node B and an output terminal;
a trigger unit connected with a first clock signal terminal, the input signal terminal and the source of the first transistor;
an output unit connected with a second clock signal terminal, the output terminal and a drain of the first transistor;
a second transistor, a gate thereof being connected with the control node B, a source thereof being connected with the source of the first transistor, a drain thereof being connected with the drain of the first transistor,
the pulling-up close unit closes the first pulling-up unit and the second pulling-up unit when the input signal terminal inputs a low level, the pulling-up start unit starts the first pulling-up unit and the second pulling-up unit when the third clock signal terminal inputs the low level; the first pulling-up unit, when it is started, pulls up a source level of the first transistor, and the second pulling-up unit, when it is started, pulls up a level at the output terminal; the trigger unit outputs an input signal to the source of the first transistor when the first clock signal terminal inputs the low level, the first transistor inputs the input signal to the output unit when the input signal terminal inputs the low level, the output unit holds the input signal and outputs the input signal when the second clock signal terminal inputs the low level; meanwhile the first transistor keeps in a turn-off state when the input signal terminal inputs a high level; the second transistor keeps being turned on to pull up a drain level of the first transistor and stop the output unit from outputting a signal when the control node B is at the low level; and the second transistor keeps being turned off when the control node B is at the high level,
wherein, except for a first shift register unit and a last shift register unit of the plurality of shift register units connected in series, the output terminal of each of remaining shift register units is connected to the input signal terminal of a next shift register unit adjacent thereto.

6. The shift register circuit according to claim 5, wherein in each of the shift register units,
the pulling-up close unit comprises a fifth transistor, a gate of the fifth transistor being connected with the input signal terminal, a source of the fifth transistor being connected with the high level terminal, and a drain of the fifth transistor being connected with the control node B;
the pulling-up start unit comprises a sixth transistor, a gate of the sixth transistor being connected with the third clock signal terminal, a source of the sixth transistor being connected with the low level terminal, and a drain of the sixth transistor being connected with the control node B;
the first pulling-up unit comprises a fourth transistor, a gate of the fourth transistor being connected with the control node B, a source of the fourth transistor being connected with the high level terminal, and a drain of the fourth transistor being connected with the source of the first transistor;
the second pulling-up unit comprises a seventh transistor and a second capacitor, a gate of the seventh transistor being connected with the control node B, a source of the seventh transistor being connected with the high level terminal, and a drain of the seventh transistor being connected with the output terminal; and two electrodes of the second capacitor being connected to the gate and the source of the seventh transistor, respectively;

the trigger unit comprises a third transistor, a gate of the third transistor being connected with the first clock signal terminal, a source of the third transistor being connected with the input signal terminal, and a drain of the third transistor being connected with the source of the first transistor;

the output unit comprises an eighth transistor and a first capacitor, a gate of the eighth transistor being connected to the drain of the first transistor, a source of the eighth transistor being connected to the second clock signal terminal, and a drain of the eighth transistor being connected to the output terminal; and two electrodes of the first capacitor being connected with the gate and the drain of the eighth transistor, respectively.

7. The shift register unit according to claim 6, wherein in each of the shift register units, duty ratios of the low level of the clock signals at the first clock signal terminal, the second clock signal terminal and the third clock signal terminal are all 1:3.

8. The shift register unit according to claim 7, wherein in each of the shift register units, a low level signal at the second clock signal terminal begins after the low level signal at the first clock signal terminal ends, the low level signal at the third clock signal terminal begins after the low level signal at the second clock signal terminal ends, and a next low level signal at the first clock signal terminal begins after the low level at the third clock signal terminal ends.

9. A display device, comprising:
a display area having a plurality of pixels for displaying an image;
a shift register circuit for transferring a scanning signal to the display area; and
a data driving circuit for transferring a data signal to the display area,
wherein the shift register circuit comprises a plurality of shift register units connected in series, and each of the shift register units comprising:
a first transistor, a gate thereof being connected with an input signal terminal,
a pulling-up close unit connected with a high level terminal, the input signal terminal and a control node B;
a pulling-up start unit connected with a low level terminal, a third clock signal terminal and the control node B;
a first pulling-up unit connected with the high level terminal, the control node B and a source of the first transistor;
a second pulling-up unit connected with the high level terminal, the control node B and an output terminal;
a trigger unit connected with a first clock signal terminal, the input signal terminal and the source of the first transistor;
an output unit connected with a second clock signal terminal, the output terminal and a drain of the first transistor;
a second transistor, a gate thereof being connected with the control node B, a source thereof being connected with the source of the first transistor, a drain thereof being connected with the drain of the first transistor, the pulling-up close unit closes the first puffing-up unit and the second puffing-up unit when the input signal terminal inputs a low level, the puffing-up start unit starts the first puffing-up unit and the second puffing-up unit when the third clock signal terminal inputs the low level; the first pulling-up unit, when it is started, pulls up a source level of the first transistor, and the second pulling-up unit, when it is started, pulls up a level at the output terminal; the trigger unit outputs an input signal to the source of the first transistor when the first clock signal terminal inputs the low level, the first transistor inputs the input signal to the output unit when the input signal terminal inputs the low level, the output unit holds the input signal and outputs the input signal when the second clock signal terminal inputs the low level; meanwhile the first transistor keeps in a turn-off state when the input signal terminal inputs a high level; the second transistor keeps being turned on to pull up a drain level of the first transistor and stop the output unit from outputting a signal when the control node B is at the low level; and the second transistor keeps being turned off when the control node B is at the high level, wherein, except for a first shift register unit and a last shift register unit of the plurality of shift register units connected in series, the output terminal of each of remaining shift register units is connected to the input signal terminal of a next shift register unit adjacent thereto.

* * * * *